US005495180A

United States Patent [19]
Huang et al.

[11] Patent Number: 5,495,180
[45] Date of Patent: Feb. 27, 1996

[54] DC BIASING AND AC LOADING OF HIGH GAIN FREQUENCY TRANSISTORS

[75] Inventors: Chern I. Huang, Beavercreek; Mark Calcatera, Spring Valley, both of Ohio

[73] Assignee: The United States of America as represented by the Secretary of the Air Force, Washington, D.C.

[21] Appl. No.: 194,997

[22] Filed: Feb. 4, 1994

[51] Int. Cl.$^6$ .......................... G01R 27/26; G01R 31/28; H01P 1/162

[52] U.S. Cl. .......................... 324/765; 324/768; 324/73.1; 324/769; 333/238; 437/8

[58] Field of Search .................................. 324/765, 768, 324/769; 333/238

[56] References Cited

U.S. PATENT DOCUMENTS

| | | | |
|---|---|---|---|
| 4,978,915 | 12/1990 | Andrews, Jr. et al. | 324/765 |
| 5,187,110 | 2/1993 | Aina et al. | 437/34 |
| 5,192,698 | 3/1993 | Schuermeyer et al. | 437/40 |
| 5,192,700 | 3/1993 | Shimura | 437/41 |
| 5,225,796 | 6/1993 | Williams et al. | 333/238 |
| 5,266,894 | 11/1993 | Sakagi et al. | 324/765 |

Primary Examiner—Kenneth A. Wieder
Assistant Examiner—Barry C. Bowser
Attorney, Agent, or Firm—Gerald B. Hollins; Thomas L. Kundert

[57] ABSTRACT

A small sized energy conveying and signal dissipating loading apparatus for use in the testing of a transistor of the high gain high frequency type is disclosed. The energy conveying and loading device of the invention employs a transmission line-like network of distributed components in order to roll off and dampen or dissipate the high frequency alternating current response of the transistor under test while also being electrically invisible for measuring the low frequency or DC characteristics of the transistor under test. The described energy communicating and loading apparatus is compatible with the temperatures of a test environment for even the most extreme environment transistor devices and allows convenient placement in the test environment immediately adjacent the transistor under test. The load allows testing of multiple transistor devices with reasonable space and cost requirements. Use of the energy communicating and loading invention with a hetrojunction bipolar transistor of the microwave type and in conjunction with discrete bypass capacitors are also disclosed.

13 Claims, 3 Drawing Sheets

DC BIASING AND AC LOADING OF HIGH GAIN FREQUENCY TRANSISTORS

The invention described herein may be manufactured and used by or for the Government of the United States for all governmental purposes without the payment of any royalty.

BACKGROUND OF THE INVENTION

This invention relates to the field of testing transistor and other active electronic devices and to the prevention of oscillating conditions during certain types of dynamic testing of high performance electronic devices.

In optimizing a new transistor for a particular use in an integrated circuit or a discrete component electronic application, it is frequently desirable to characterize and otherwise test the operation of the new transistor type in a testing environment which electrically simulates but is physically distinct from the operating environment expected for other transistors of the new type. Such testing often employs failure accelerating conditions which include elevated temperatures and other stresses along with periodic evaluation of transistor performance and mathematical extrapolations of the transistor's performance into a normal set of operating conditions. The use of mathematical models commonly referred to as Arrhenius equations for such extrapolations is for example now an accepted life test and reliability prediction tool in the semiconductor industry. Additional information concerning such predictions is to be found in the article authored by M. S. Ash and H. C. Gorton, I.E.E.E. Reliability, vol. 38, p. 485 (1989).

The need to extract an exemplary transistor device from its intended source and load and other environmental conditions for operation, even though desirable from the testing and reliability prediction viewpoint, is frequently found to be accompanied by technical difficulties. Especially, when the high gain, high frequency transistors that are now common in the electronic art, are extracted from a normal microwave environment and operated, perhaps in large numbers, in a high stress environment are these technical difficulties likely to be encountered. The gallium arsenide heterojunction bipolar microwave transistor is a specific case in point for these difficulties.

A particularly troublesome example of these technical difficulties is the pronounced tendency of these transistors when operated under normal bias conditions, to enter a mode of oscillation at some microwave or other high frequency. For example, the well known Miller effect capacitance in combination with the unusually large gain bandwidth product (gain bandwidths of 20 GHz being common for such devices) almost assures difficulty in achieving an oscillation-free multiple transistor device life test or characterization test. The presence of an oscillating mode of operation during such testing often influences the transistor's operation in a manner which jeopardizes or confuses the desired life test data. In order to effectively measure the characteristics of transistors on life test or transistors under characterization testing, it has therefore become common practice to accomplish tests of these types while the transistor is operating in a purely DC operating mode that is by brute force, free of the oscillating conditions. In this practice the life test environment is arranged to enforce-especially by loading, this pure DC and oscillation free operation.

The present invention is believed to provide major assistance in achieving the desired test operating conditions for a plurality of tested transistor devices and to accomplish this improvement in a manner which is low in cost, physically convenient, and especially compatible with the high performance characteristics of present day transistor devices. More precisely, the present invention provides a tested transistor loading and communicating arrangement which is especially desirable for use with high temperature transistors including gallium arsenide and other transistors whose useful characteristics may extend well into the microwave range of operating frequencies.

Although the use of energy feeding and signal loading devices during transistor testing has been known in the electronic art, and has included such devices as commercially fabricated bias-Tee networks which may be located external to the high temperature testing environment of the transistors under test, such devices have proven to be impractical from the environment requirement, financial cost, physical size and electrical performance viewpoints. The presence of low temperature plastic components in known commercial bias-T circuits and their extremely large physical size with respect to transistors of the microwave type has made their use ineffective in many test environments. The present invention is believed to offer a significant improvement over these previously employed arrangements.

SUMMARY OF THE INVENTION

The present invention provides a small sized electrically efficient RF loading and energy coupling arrangement that may be used during the characterization, life testing, and other operation of high performance transistor devices. It is particularly notable that the energy communicating and alternating current loading device of the present invention is of sufficiently small size and of such component composition as to be receivable immediately adjacent a transistor under test. Moreover the device of the present invention can be subjected to the most severe of the expected test temperatures and other test conditions.

It is an object of the present invention therefore, to provide a high temperature compatible transistor loading and energy communicating assembly.

It is another object of the invention to provide a transistor energy communicating and loading assembly which may be fabricated using integrated circuit materials and processing techniques.

It is another object of the invention to provide a transistor energy communicating and loading assembly which is of sufficiently small size as to be usable with convenience in a plural transistor test environment.

It is another object of the invention to provide a transistor energy communicating and loading assembly which may be fabricated at reasonable cost.

It is another object of the invention to provide a transistor loading and communicating assembly which is amenable to either one time use during a particular test sequence or to multiple uses with a sequence of different transistors under test.

It is another object of the invention to provide a transistor energy communicating and loading assembly having electrical characteristics that are effectively invisible during direct current and low frequency operation and measurement of the transistor under test.

It is another object of the invention to provide a transistor energy communicating and loading assembly having a very large DC shunt input impedance and a very small DC series impedance.

It is another object of the invention to provide a transistor energy communicating and loading assembly which may be used in duplicate at both the input port and the output port of a transistor under test.

It is another object of the invention to provide a transistor energy communicating and loading assembly which seizes upon the advantages of a distributed element transmission line-like network.

It is another object of the invention to provide a transistor energy communicating and loading assembly wherein desirable alternating current energy signal losses are achieved by way of capacitance coupling with an intentionally lossy element of a transmission line-like network.

It is another object of the invention to provide a transistor energy communicating and loading device that is compatible with the characteristics of different types of transistors.

It is another object of the invention to provide a transistor energy communicating and loading assembly which is capable of achieving unconditional operating stability in a DC energized test.

It is another object of the invention to provide a transistor energy communicating and loading assembly which is fabricated in the form of a double layered transmission line structure.

It is another object of the invention to provide a transistor energy communicating and loading assembly that is compatible with transistors of widely varying physical dimensions and input/output impedance levels.

It is another object of the invention to provide a transistor energy communicating and loading assembly which enables the presentation of undistorted and oscillation free low frequency displays of transistor characteristics on transistor curve tracing instruments.

Additional objects and features of the invention will be understood from the following description and claims and from the accompanying drawings.

These and other objects of the invention are achieved by the method of thermally testing an engaged high gain high frequency transistor comprising the steps of:

connecting input and output ports of said transistor under test to separate alternating current signal dissipating but direct current signal invisible transmission line elements that are disposed in close physical proximity with said transistor under test;

biasing said transistor under test into an input port to output port signal gain generating predetermined direct current operating mode via said transmission line elements;

surrounding both said transistor under test and said transmission line elements with a predetermined elevated temperature environment for a predetermined time and temperature cycle;

verifying the absence of feedback coupling included alternating current signal oscillations at said transmission line loaded transistor under test input and output signal ports;

measuring the direct current characteristics of said transistor under test from a location external of said elevated temperature and through said transmission line elements.

DETAILED DESCRIPTION

Figure 1:
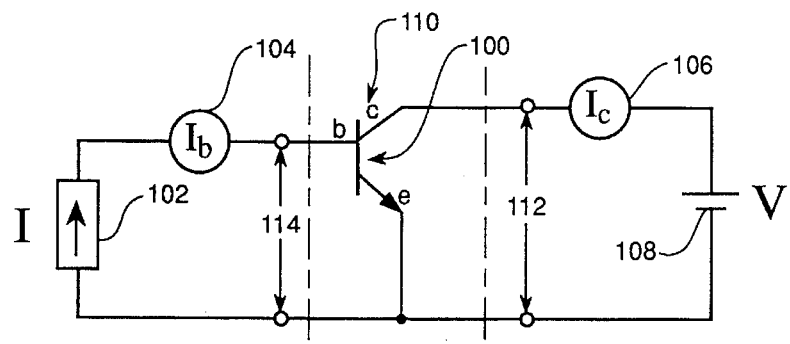
FIG. 1 shows a conventional test circuit for a bipolar transistor.

FIG. 1 in the drawings shows a conventional circuit for operating and testing a transistor such as the bipolar transistor 100. In the FIG. 1 circuit current signals from a source 102 are applied to the input port 114 of the transistor 100, port 114 comprising the emitter and base terminals of the transistor 100. The current applied to the port 114 is measured by the base current indicating meter 104 and this current is amplified in the transistor 100 to some larger value, determined by the gain or beta of the transistor 100, to a value which is measured by the collector circuit meter or current indicating device 106. A collector supply voltage from a source 108 is applied to the port 112 of the FIG. 1 transistor, that is to the collector and emitter terminals of the transistor. During operation of the FIG. 1 illustrated NPN transistor 100 the collector terminal is provided with a positive operating potential with respect to the emitter terminal using the battery 108. The designation of collector, base and emitter terminals in the FIG. 1 drawing, is indicated at 110.

The base terminal of the transistor 100 is operated with a positive voltage with respect to emitter terminal so that a forward current flows across the base to emitter junction of the transistor 100. The FIG. 1 circuit is in fact the essence of the energizing and signal processing circuit used to test or operate a typical bipolar transistor. A circuit of this FIG. 1 type is especially useful for operating audio, video and even high frequency transistor types and is also in essence the general nature of a family of transistor characteristic measuring electrical instruments which are known as transistor curve tracers.

Figure 2:
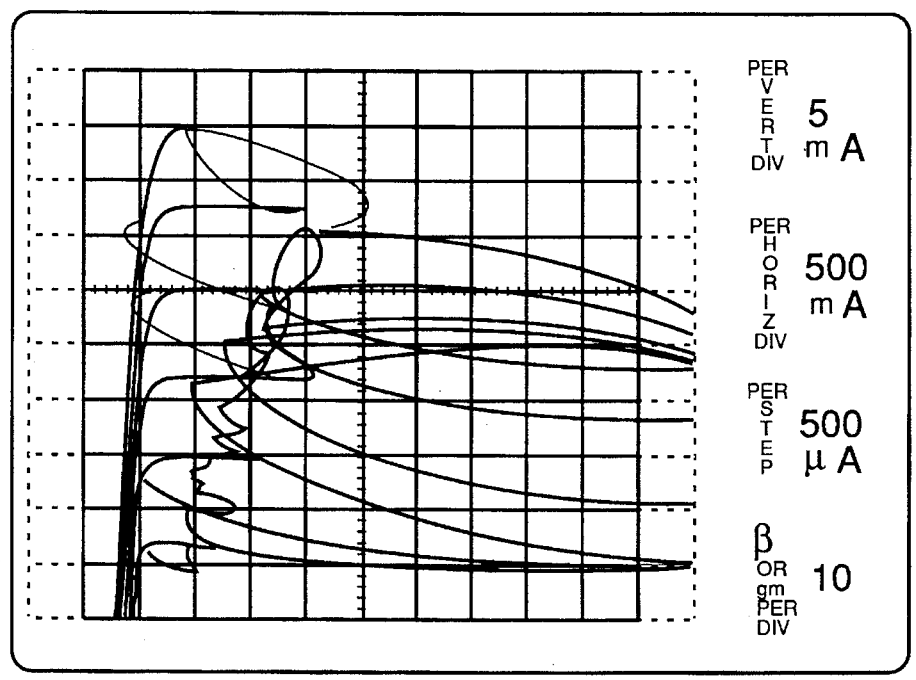
FIG. 2 shows the result of a DC test of a high gain high frequency transistor such as a HBT according to the FIG. 1 test circuit.
Figure 4:
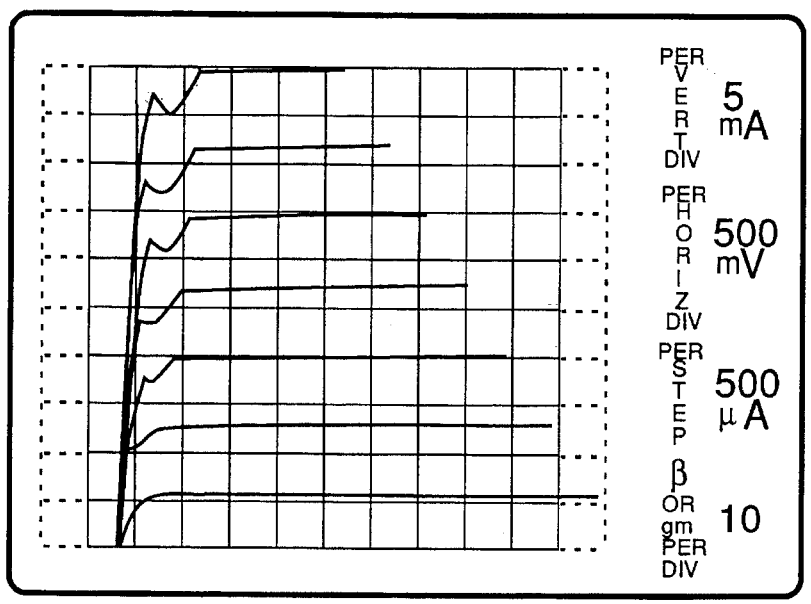
FIG. 4 shows an DC test of an HBT according to the FIG. 3 test circuit.
Figure 9:
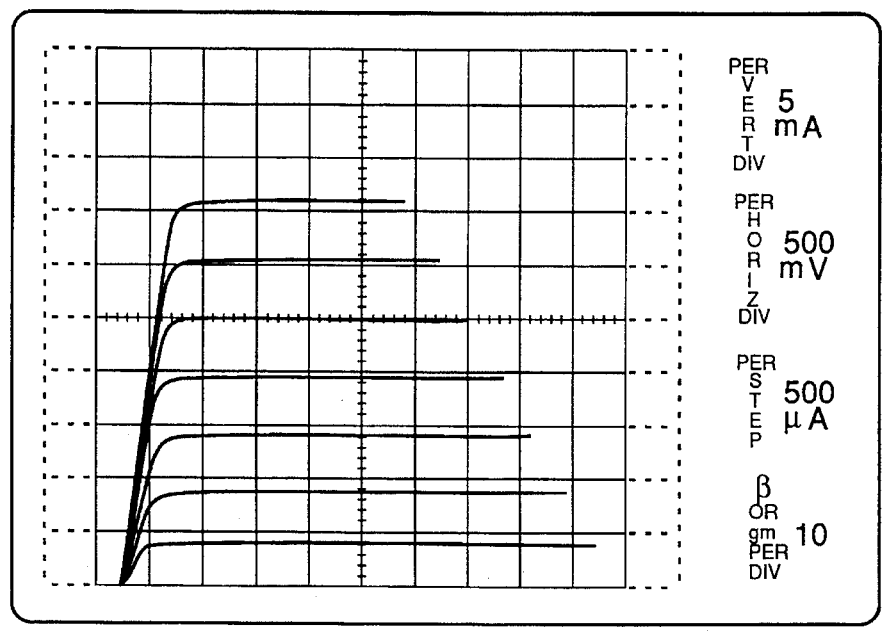
FIG. 9 shows testing of an HBT in the manner of FIG. 2 with the present invention.

In these curve tracing instruments, the signal source 102 is in the form of a constant current generator having successively increasing output current levels which drive the transistor 100 into a series of constant current with varying collector voltage events whose operating parameters are displayed as successively increasing amplitude traces on a cathode ray tube embodiment of the meter indicated at 106. In such instruments, the battery 108 is replaced with a signal of slowly time varying voltage whose amplitude is displayed along the horizontal axis of a cathode ray tube display and whose current magnitude is displayed along the vertical axis of this cathode ray tube, the meter 106 appearing therefore as such a vertical axis display. A display of this nature is indicated in FIGS. 2, 4, and 9 of the present disclosure with the desired form of such a transistor characteristic display appearing in FIG. 9. In FIG. 9, the successively elevated generally horizontal lines represent the result of stepwise increased current levels from the source 102. Instruments of this type are commonly used in the electronics art and are available from manufacturers such as Tektronix Inc. of Portland Or.

In contrast with the desirable FIG. 9 display of transistor characteristics, the display in FIG. 2 represents the type of results achieved when a modern high gain high frequency transistor is energized or tested according to the FIG. 2 essential electrical circuit. In FIG. 2, the curving and convoluted array of successive traces, that is, the traces which are not a part of the generally horizontal lines shown in FIG. 9, are the result of the transistor under test being energized into a condition of self oscillation by its operation in a simple circuit of the FIG. 1 type. Clearly the conditions represented by the FIG. 2 display are both difficult to comprehend and suggestive of an uncontrolled and disorganized operating mode. In addition to being difficult or impossible to interpret such mode may well represent exposure of the transistor under test to undesirable operating regions wherein its performance can be irreversibly degraded.

Figure 3:
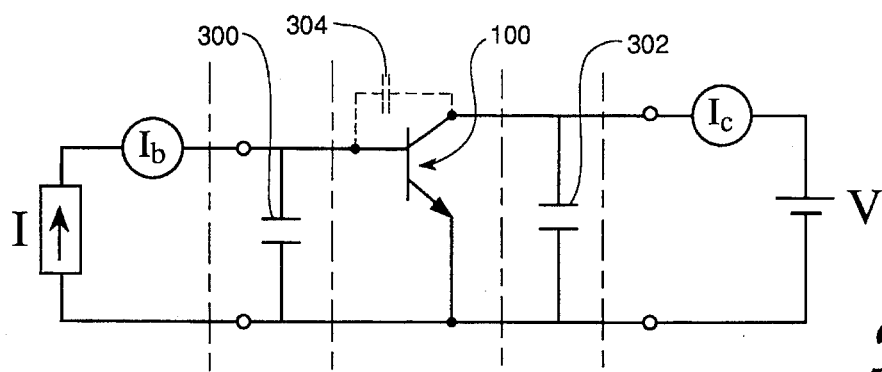
FIG. 3 shows an improved arrangement of the FIG. 1 test circuit.

FIG. 3 in the drawings indicates a modification which may be performed on the FIG. 1 operating circuit in order to stabilize the transistor under test 100 and achieve a more desirable form of the display in FIG. 2 as is shown in FIG. 4 of the drawings. The FIG. 3 circuit is modified from the circuit of FIG. 1 of course by the addition of the frequency roll off capacitors 300 and 302 at the input and output ports of the transistor under test respectively.

In a simplistic view of the effect of the capacitors 300 and 302, it may be stated that the capacitor 300 serves to convey the feedback signal currents arriving at the base of the transistor 100 by way of the Miller effect capacitance 304 to the signal ground node. The capacitor 300 thereby prevents entrance of these Miller effect feedback currents into the base terminal of the transistor 100 where their amplification and the resulting oscillation ensues. In a related manner the capacitor 302 may be said to act as a current shunt to higher frequency currents originating in the transistor 100. The capacitor thereby precludes current coupling by way of the Miller effect capacitance 304 back into the transistor base circuitry and thereby also serves to limit the oscillating tendencies of the transistor 100.

Unfortunately the capacitors 300 and 302 are only marginally effective in stabilizing the transistor 100 when this transistor is embodied in the form of a high gain high frequency device such as a heterojunction bipolar transistor having microwave frequency range capabilities. As a result of the Miller effect coupling capacitance 304 having a capacitance value which is inversely related to the collector to base voltage of the transistor 100 the effect of this feedback path capacitance is most pronounced at lower values of collector voltage. Transistor oscillation as are represented by the lower voltage discontinuity between the upward sloping and horizontal line portions of the characteristics in FIG. 4 are therefore frequently encountered with an HBT device operated according to the FIG. 3 circuit. Other effects in addition to the Miller effect capacitance, effects such as lead inductance and additional capacitancy also contribute to the unstable operation of the an HBT device as is represented in FIG. 4.

In the transistor life test environment where numerous transistors are operated in a temperature control led oven and accessed by way of long leads passing through a sealed opening in the oven wall, the FIG. 3 circuit represents a convenient and physically plausible operating arrangement for the transistors under test. Frequently however, the results indicated in FIG. 4 are even yet encountered and suggest that additional circuit improvement is needed.

One such circuit improvement involves the use of a series connected discrete capacitance and resistance element network shunting the input and output ports 114 and 112 of the transistor under test. In this arrangement which is preferably achieved with a network identified as a bias Tee network, the DC base and collector currents are communicated by way of additional series connected discrete inductance elements directly to the base and collector terminals. Bias Tee circuits of this type have been fabricated commercially for use in testing transistors of the HBT and other high performance types. Such circuit arrangements are often fabricated in the form of an enclosed package having input and output terminals which are connected to a transistor under test with random lengths of wire. Despite this second improvement on the FIG. 1 circuit, the testing of state of the art high performance transistors is yet found to incur the instabilities represented in FIG. 4 under at least some operating conditions. In addition, the discrete component package for these bias Tee circuits is found to be so large as to be impractical for use with numerous transistors that are simultaneously tested. These bias tee circuits when arranged for microwave device testing are also found to be expensive in nature, often involving a cost in the range of five hundred to fifteen hundred dollars each. Such cost becomes especially undesirable in the testing of hundreds of exemplary transistor devices under environmental or characterizing conditions.

Figure 5:
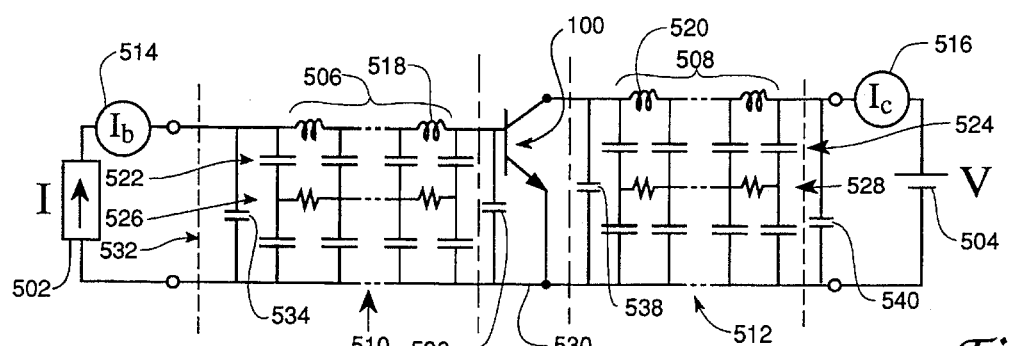
FIG. 5 shows an improved test circuit according to the present invention.

FIG. 5 in the drawings shows an electrical schematic diagram of a stabilizing arrangement according to the present invention to improve the transistor testing art. In the FIG. 5 testing arrangement the transistor under test 100 is coupled to a source of base operating bias 502 by way of a distributed element transmission line-like electrical assembly which is indicated at 506. A similar assembly indicated 508 is used to couple the output port of the transistor under test 100 to a source of collector bias supply 504. As is indicated by the dotted line regions at 510 and 512 the assemblies 506 and 508 are in fact of a distributed electrical element type rather than of the discrete component type and include in fact a large or infinite number of separate inductive capacitive and resistive elements.

It is the intention of the present invention that the transmission line-like electrical assemblies 506 and 508 accomplish a lossy or dissipative communication of alternating current signals to and from the transistor under test 100. This communication is accomplished with such efficiency as to render the transistor's operation unconditionally stable while connected to these assemblies. At the same time it is the intention of the present invention that the transmission line-like electrical assemblies 506 and 508 be essentially invisible with respect to measuring the DC and low frequency alternating current characteristics of the transistor under test 100.

In particular it should be noted that the FIG. 5 assemblies 506 and 508 provide direct current paths of low electrical resistance, in the form of the inductances 518 and 520, for communicating with the base and collector elements of the transistor under test 100. These assemblies also provide the AC or capacitance coupling indicated at 522 and 524 to the loss generating resistance elements generally indicated at 526 and 528. This effective DC invisibility and large AC losses of the transmission line-like electrical assembly 506 and 508 are in fact a significant advantage of the present invention testing arrangement. An additional significant advantage relates to the achievable high temperature capability and small physical size embodiments of the transmission line-like electrical assemblies.

Figure 6:
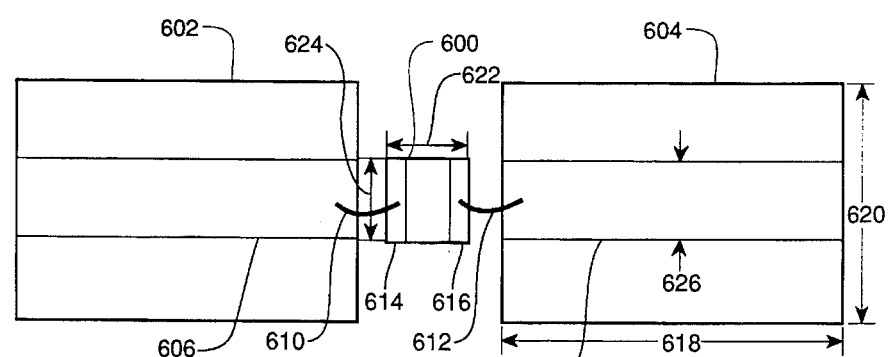
FIG. 6 shows a plan view of a transistor test according to the present invention.
Figure 7:
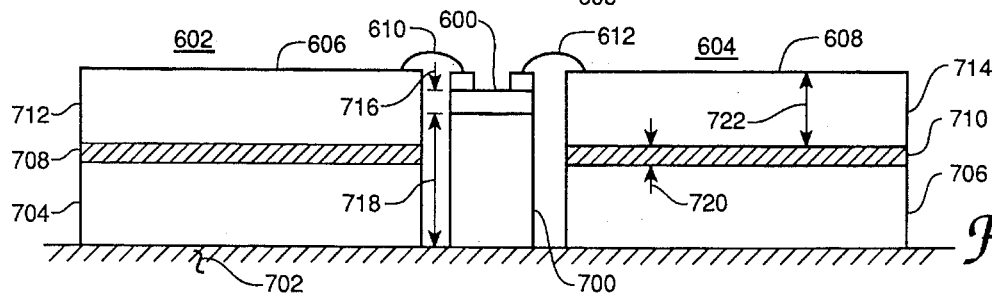
FIG. 7 shows an elevation view of a transistor test according to the present invention.
Figure 8:
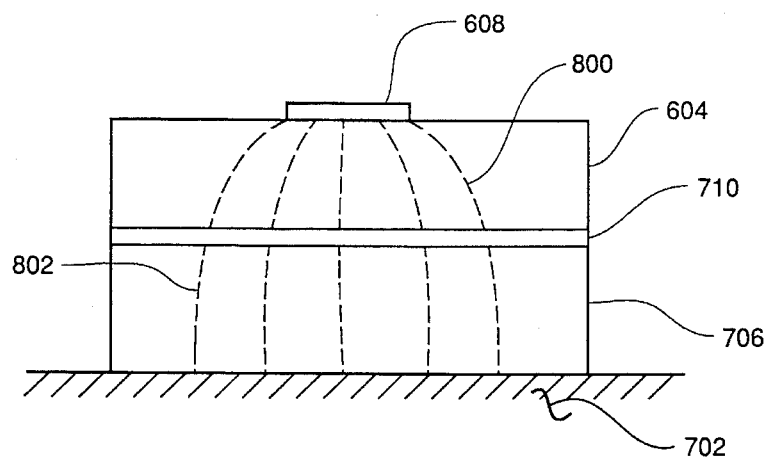
FIG. 8 shows conditions within a transistor energizing and loading assembly according to the present invention.

The realization of the transmission line-like electrical assemblies 506 and 508 in the form of integrated circuit fabrication technique accomplished assemblies is of course an additional significant advantage of the present invention. The physical nature of these integrated circuit fabrication techniques achieved assemblies is generally indicated in FIGS. 6, 7, and 8 of the drawings herein. In FIG. 6 the transistor under test is indicated at 600 and the transmission line-like electrical assemblies 506 and 508 are indicated at 602 and 604, in a viewed from above or plan view perspective. Also shown in FIG. 6 are the linear conductor members 606 and 608 which at microwave frequency comprise the microinductor elements shown at 518 and 520 in the FIG. 5 schematic drawing. The bonding wires which connect the transistor electrode pads 614 and 616 with the linear conductor 606 and 608 are indicated at 610 and 612 in the FIG. 6 view.

Dimensions for one embodiment of the present invention are also shown in the FIG. 6 view, these dimensions including the length and width of one transmission line-like assembly 604 as indicated at 618 and 620. These dimensions are typically in the range of 0.25 inch and 0.5 inch respectively. Also shown in FIG. 6 and FIG. 7 are the length, width, and height of the typical transistor under test 600, these dimensions being indicated at 622 and 624 in FIG. 6 and at 716 in FIG. 7 and having the typical values of 0.01 inch and 0.01 inch. A typical width dimension for the linear conductor 608 is also indicated at 626 in FIG. 6 and represents a dimension of 0.025 inch in the herein described embodiment of the invention.

FIG. 7 in the drawing shows additional physical details of the FIG. 6 transistor testing arrangement in a elevation view of the FIG. 6 components. The numeric labels in FIG. 7 follow the heretofore used practice of the original identification number being used for previously identified elements which reappear in the FIG. 7 drawing; parts newly appearing in FIG. 7 are provided with numbers in the seven hundred series.

The FIG. 7 elevation view therefore shows that the transistor under test 600 is mounted on a heat dissipating block of material such as copper as is indicated at 700. The entire FIG. 7 assembly is mounted on a metallic ground plane member 702 which may be fabricated of a conductive material such as gold. Additionally indicated in the FIG. 7 elevation view is the 3 layer structure nature of the transmission-line like assemblies which are shown at 506, 508, 602 and 604 in FIGS. 5 and 6. As is indicated in FIG. 7, the assembly 602 is comprised of a linear conductor 606 which is received on an upper layer insulation member 712. Between this upper insulating layer 712 and a second or lower insulating layer 704 is disposed an electrically lossy or resistive film layer 708. This layer 708 corresponds to the resistive elements shown at 526 and 528 in FIG. 5. The layers 704, 708, and 712 are of course duplicated in the output port transmission-line like electrical assembly 604 in the form of the layers 706, 710, and 714 respectively. The thickness of the insulating layers 704, 706, 712, and 714, a typical insulating layer thickness dimension for the present invention is indicated as 722 in FIG. 7 and may be a thickness of 0.025 inch.

In the FIG. 7 drawing the metal ground plane member 702 provides an embodiment of the common conductor 530 in the FIG. 5 schematic drawing. Other correspondences between the FIG. 7 and FIG. 5 drawings include the insulating layer 712 comprising the dielectric element of the capacitor indicated at 522. The upper and lower plates of these capacitors comprise the linear conductor 606 and the resistive film layer 708 respectively. In a similar manner the capacitors indicated at 532 in FIG. 5 are comprised of the resistive film layer 708 and the ground plane member 702 and the insulating layer 704. Similar correspondences prevail for the layers 706, 710 and 714 and the electrical elements of the transmission line like electrical assembly 508 in FIG. 5.

Also shown in the FIG. 7 view are the additional dimensions of thickness for the transistor under test 600, as indicated at 716; a thickness dimension of 0.02 inch is typical for the herein described hetrojunction bipolar microwave transistor of moderate input and output impedance characteristics. A thickness dimension for the heat conducting and dissipating material 700 is indicated at 718 in FIG. 7; this thickness being of any convenient length that will provide both effective heat transfer and reasonably short bonding conductor length. A dimension of 0.03 inch is found suitable for the herein described embodiment. The electrically glossy layers 708 and 710 may have a thickness dimension in the range of about 0.001 inch as is indicated at 720 in FIG. 7.

FIG. 8 in the drawings shows an endwise view of the FIG. 6 and FIG. 7 embodiment of the FIG. 5 electrical circuit. In the FIG. 6 view several of the above described elements are repeated and in addition the lines of the electric field between the linear conductor 608 and the electrically lossy resistive film layer 710 are indicated at 800. The similar lines of electric field between the electrically lossy resistive film layer 710 and the ground plane 702 are indicated at 802.

In view of the combined effect of the FIGS. 5, 6, 7, and 8 drawings, several additional details of the present invention testing arrangement may be appreciated. Among these details is the electrically lossy nature of the resistor elements indicated at 526 and 528 in FIG. 5 as these elements are embodied in the form of the electrically lossy resistive film layers 708 and 710 in FIG. 7. Preferably these layer 708 and 710 are fabricated from a thin film of Nichrome or other resistive material. It is in fact largely the electrical losses achieved in these film layers which are AC coupled to the base and collector electrodes of the transistor under test 100 in FIG. 5. Preferably the film layer 708 and 710 are provided with electrical resistivity in the range of 50 to 100 ohms per square, the lower 50 ohm value being most easily obtained in practice and the upper 100 ohm value being most desirable form an electrical performance view point. The resistance film-adjacent insulating layers 704, 706, 712, and 714 may be fabricated from a material such as alumna ($Al_2O_3$), such composition providing the desirable temperature immunity and desirable electrical properties.

As is also indicated in the FIGS. 6, 7 and 8 drawings the inductive elements 518 and the capacitive elements 522 and 532 are each embodied in the form of inherent properties of the elements shown in FIGS. 6, 7, and 8, that is the inductive elements 518 are embodied in the form of the inherent inductance of the linear conductor 606 in FIG. 6, the capacitors 528 in the form of the inherent capacitance between the linear conductor 606 and the resistive film layer 708 and the capacitors 532 in the form of the inherent capacitance between the resistive film layer 708 and the ground plane member 702.

The distributed nature of the inductive elements 518, and the capacitors 522 and 532 are of course desirable from both the physical and electrical aspects of the FIGS. 5, 6, 7, and 8 apparatus. Distributed element transmission lines as these elements in fact comprise are efficient in the microwave range of frequencies. In addition such arrangements provide both small physical size and temperature tolerance which would be difficult or impossible to achieve with discrete components as was described above in connection with the bias tee loading devices that have been commonly used heretofore.

An additional detail of the FIG. 5 schematic circuit which may be appreciated in view of the disclosures of FIGS. 6, 7, and 8 is the capacitance isolation of the resistance elements indicated at 526, that is the location of the resistive film layer 708 intermediate the conductive members 606 and 702. This double capacitance isolation is of course desirable from the direct current measurement view point in that it further isolates the DC path of the inductors 518 from the conductor 510. This isolation is also desirable from the view point that the distributed capacitors represented at 532 provide the desired current flow for achieving alternating current losses in the resistive layer 708.

In fabricating the transmission line-like electrical assembly shown in FIG. 6, 7, and 8 of the drawings it is found convenient to deposit the electrically lossy resistive film layer 708 onto a substrate 704 and to deposit the metal conductor or linear conductor 606 onto a substrate 712 using normal integrated circuit deposition techniques including RF sputtering or evaporation. Following these depositions the substrate 712 is assembled on top of the substrate 704. This overall assembly of the conductor 606, the lossy film layer 708 and the insulator layers 712 and 704 may then be attached to the conductive ground plane using a conductive epoxy adhesive material. Bypass capacitors having a nominal value of 0.01 microfarad are preferably utilized to connect both ends of the transmission line conductor 606 to the common ground plane. These additional capacitors are shown at 534, 536, 538 and 540 in the FIG. 5 drawing and provide damping of most but not all of the RF signals.

FIG. 9 in the drawings shows the result of adding the transmission line like electrical assemblies 506 and 508 to the testing of a high gain, high frequency transistor device such as the heretofore referred to heterojunction bipolar microwave transistor. As indicated by the clean and well defined characteristic lines in FIG. 9, all traces of oscillation instability are removed by employment of the assemblies 506, and 508 and the bypass capacitors 534, 536, 538 and 540.

It is especially notable that this marked improvement in testing is achieved with the relatively small area requirement indicated at 618 and 620 in FIG. 6 and that these small dimensions are reasonably compatible with the dimensions of the transistor under test so that close physical placement of the transmission line-like electrical assemblies 602 and 604 adjacent the transistor under test is feasible.

Figure 10:
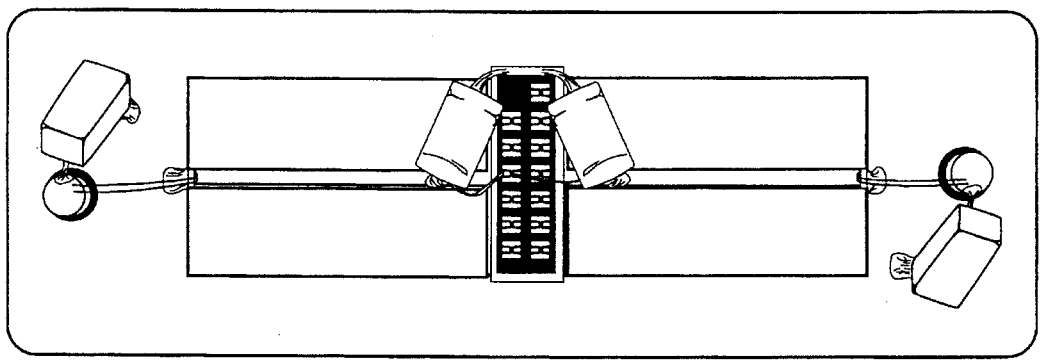
FIG. 10 shows a microphotograph of a tested transistor connected to loads according to the invention.

FIG. 10 in the drawings in fact, shows a microphotograph-like representation of a transistor under test that is joined to input port and output port transmission line-like electrical assemblies and bypass capacitors according to the present invention. In the FIG. 10 drawing, the HBT transistor under test appears as one transistor of a twelve transistor assembly that is located at the center of the drawing and the transmission-line like load elements of the present invention appear immediately to the left and right of the transistor under test. Bonding wires which join the one of twelve transistor to the transmission line-like load elements also appear in the FIG. 10 drawing. In the FIG. 10 arrangement the elements disposed at about forty five degrees of orientation adjacent each end of the transmission line-like load elements, are the bypass capacitors discussed above.

The FIG. 10 drawing originates in a microphotograph of a multiple transistor test assembly wherein five twelve transistor assemblies under test and their loads are received in the cavity of a ceramic package and wherein the terminals at opposed ends of the transmission line-like load elements are wire bond connected to the load elements and provide signal coupling to the outside environment.

The physically compatible sizes of the present invention devices with the transistor under test is readily apparent in the FIG. 10 view; here the reasonable possibility of using the present invention devices with a relatively large number of transistors under test is also comprehensible. The convenience of locating these loading and energy supplying devices according to the invention within the high temperature environment of an accelerated life test facility is also apparent of noting.

It is also notable that the above identified materials for use in fabricating the transmission line-like electrical assemblies 602 and 604 are fully compatible with the temperature ranges of up to two hundred degrees Celsius that may be reasonably expected in testing present day semiconductor devices.

It is of course worth noting that the concepts of the present invention are intended for use under test conditions that are focused on the direct current or low frequency characteristics of a transistor device. The above referred to curve tracing instruments, for example, operate with sweeping and signal frequencies of 30 and 60 Hz and are therefore; largely unaffected by the attenuated frequency response of a transistor loaded according to the present invention. It is notable for example that with use of the present invention loading arrangements at the input and output port of a microwave transistor the transistor's frequency response characteristics are degraded from the microwave regions to the point of having a 3 db roll-off frequency that is in the range of about one megahertz.

Several variations of the invention are of course possible. According to one of these variations, the transmission line-like electrical assemblies shown in the drawings may be employed at only one port of the transistor under test. The disclosed employment of these loads at both the input and output port of a transistor under test is of course most effective in achieving operational stability, however some transistors and some testing arrangement may permit the use of only a single loading assembly.

Although the invention has been disclosed in terms of a bipolar transistor of a particular type as the transistor under test, it may be employed with other transistor types including field effect transistors or indeed with other active devices such as a vacuum tube or even electrical switching devices such as thyristors. It is also of course, possible to vary the physical size of the transmission line-like electrical assembly disclosed herein for use with smaller or larger transistors or where increased loading is desired.

According to another variation, of the invention, additional resistive or capacitive circuit chips can be stacked on top of the input and/or output conductive transmission lines to introduce additional radio frequency loads to the transistor under test. That is, in lieu of employing a single loading device according to the present invention at the input or output port of a transistor under test, multiple of these loads may be used at either or both ports when necessary in order to achieve a quiet and stable test performance.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:

1. The method of thermally testing an energized high gain, high frequency transistor comprising the steps of:

connecting input and output ports of said transistor under test to separate alternating current signal dissipating but direct current signal invisible distributed element integrated circuit transmission line arrays that are disposed in close physical proximity with said transistor under test;

biasing said transistor under test into an input port to output port signal gain generating predetermined direct current operating mode via said transmission line elements;

surrounding both said transistor under test and said transmission line arrays with a predetermined elevated temperature environment for a predetermined time and temperature cycle;

verifying the absence of feedback coupling induced alternating current signal oscillations at said transmission line loaded transistor under test input and output signal ports;

measuring the direct current characteristics of said transistor under test from a location external of said elevated temperature environment and through said transmission line elements.

2. The method of claim 1 wherein said elevated temperature is above two hundred degrees Celsius.

3. The method of claim 2 wherein said transistor is comprised of gallium arsenide semiconductor material.

4. The method of claim 3 wherein said transistor is a heterojunction bipolar microwave transistor.

5. The method of claim 4 wherein said transmission line arrays include low direct current resistance paths between input and output ports thereof and also include distributed capacitance coupling between said low direct current resistance paths and an energy dissipating resistive path.

6. The method of claim 1 wherein said thermal test comprises one of a life test and a thermal characterization test.

7. The method of claim 1 further including the step of also connecting at least one of said transistor input and output ports to a shunting discrete component bypass capacitor.

8. The method of electrically stabilized thermally testing of a two-port high gain, high frequency transistor comprising the steps of:

establishing first transistor function-enabling bias conditions in said transistor by connecting a first direct current energy source with a first pair of transistor elements signal input port of said transistor;

communicating direct current energy signals with, and attenuating alternating current energy signals appearing at, said first pair of transistor elements signal input port of said transistor, by disposing a first negligible direct current resistance and large alternating current energy dissipation-characterized distributed element integrated circuit transmission line assembly electrically between said first direct current energy source and said first pair of transistor elements signal input port of said transistor;

said first transmission line assembly being physically comparable in size with said transistor and segregated from but in physical proximity with said transistor signal input port;

setting up second transistor function-enabling bias conditions in said transistor by connecting a second direct current energy source with a second pair of transistor elements signal output port of said transistor;

transferring direct current energy signals with, and attenuating alternating current energy signals appearing at, said second pair of transistor elements signal output port of said transistor, by disposing second negligible direct current resistance and large alternating current energy dissipation-characterized distributed element integrated circuit transmission line assembly electrically between said second direct current energy source and said second pair of transistor elements signal output port of said transistor;

said second transmission line assembly being physically comparable in size with said transistor and segregated from but in physical proximity with said transistor signal output port;

concurrently subjecting both said transistor and said first and second negligible direct current resistance and large alternating current energy dissipation-characterized distributed element integrated circuit transmission line assemblies to a plurality of thermal testing environments.

9. The method of claim 8 wherein said transistor is comprised of gallium arsenide semiconductor material and wherein said first and second transmission line assemblies are comprised of high-temperature integrated circuit materials capable of enduring the highest temperature tolerated by said transistor.

10. The method of claim 9 further including the step of dissipating high frequency electrical signals at said transistor input and output ports in a Nichrome film lossy layer having distributed capacitance-coupling with signal communication path transmission line elements within said distributed element integrated circuit transmission line assemblies.

11. The method of claim 8 further including the step of attenuating additional components of alternating current energy signals appearing at one of said input and output ports by connecting a discrete capacitance bypass element in parallel with said distributed element integrated circuit transmission line assembly at said port.

12. The method of claim 8 wherein said transistor is a grounded emitter-configured heterojunction bipolar microwave transistor.

13. The method of claim 8 wherein said transistor is a grounded base-configured heterojunction bipolar microwave transistor.

* * * * *